(12) United States Patent
Tsukaguchi et al.

(10) Patent No.: US 7,128,844 B2
(45) Date of Patent: Oct. 31, 2006

(54) METAL/CERAMIC CIRCUIT BOARD AND METHOD FOR PRODUCING SAME

(75) Inventors: Nobuyoshi Tsukaguchi, Shiojiri (JP); Michihiro Kosaka, Shiojiri (JP)

(73) Assignee: Dowa Mining Co., Ltd., Tokyo (JP)

( * ) Notice: Subject to any disclaimer, the term of this patent is extended or adjusted under 35 U.S.C. 154(b) by 0 days.

(21) Appl. No.: 10/855,182

(22) Filed: May 27, 2004

(65) Prior Publication Data

US 2004/0238483 A1    Dec. 2, 2004

(30) Foreign Application Priority Data

May 30, 2003    (JP) ............... 2003-154343

(51) Int. Cl.
*H01L 21/302* (2006.01)

(52) U.S. Cl. ............ 216/13; 216/17; 216/19; 216/20; 216/34; 216/35; 216/36; 216/62; 216/65; 216/67; 438/96; 438/97; 438/720; 438/742; 438/754

(58) Field of Classification Search ............... 252/79.1; 228/245; 257/700; 427/98, 306; 428/131, 428/901

See application file for complete search history.

(56) References Cited

U.S. PATENT DOCUMENTS 3,632,435 A * 1/1972 Eriksson et al. ......... 427/98.1
4,917,958 A * 4/1990 Akai et al. .................. 428/457
2002/0050510 A1* 5/2002 Osanai et al. ............... 228/245

FOREIGN PATENT DOCUMENTS

JP    1995053581 B2 *    6/1995
JP    9-3662    1/1997

OTHER PUBLICATIONS

MSDS No. F1080; Material Safety Data Sheet; Mallinckrodt baker, Inc.; phillipsburg, NJ; Feb. 2003; Feb. 2000.*
Circuits-Base Chemicals Pte Ltd; 14, Tuas Ave. 18, Singapore 638898; Tel; 68617822; email:cbcpl@singnet.com.sg.*
Handbook of polymer Coating for Electronic Chemistry and Aplications; 2nd Edition; William Andrew Publishing; 1990.*
MSDS hyper Glossary; Safety Emporium, Laboratory and Safety Supplies; www.SafetyEmporium.com.*
The Chemistry of ferric Chloride; Printmaker today; vol. 4, No. 2; 1995; Cello Press Limited; Oxon, UK.*

* cited by examiner

*Primary Examiner*—Nadine Norton
*Assistant Examiner*—Patricia George
(74) *Attorney, Agent, or Firm*—Bachman & LaPointe, P.C.

(57) ABSTRACT

A metal layer 12 of aluminum or an aluminum alloy is formed on at least one side of a ceramic substrate 10, and a resist 14 having a predetermined shape is formed on the metal layer 12. Then, an etchant of a mixed solution prepared by mixing ferric chloride with water without adding any acids is used for etching and removing an undesired portion of the metal layer 12 to form a metal circuit 12 on the at least one side of the ceramic substrate 10.

6 Claims, 3 Drawing Sheets

METAL/CERAMIC CIRCUIT BOARD AND METHOD FOR PRODUCING SAME

BACKGROUND OF THE INVENTION

1. Field of the Invention

The present invention generally relates to a metal/ceramic circuit board and a method for producing the same. More specifically, the invention relates to a metal/ceramic circuit board wherein a metal circuit, such as an aluminum circuit or an aluminum alloy circuit, is formed on a ceramic substrate, and a method for producing the same.

2. Description of the Prior Art

Conventionally, copper plates have been used as metal circuit plates of metal/ceramic circuit boards for power modules. In recent years, in order to realize a higher heat cycle resistance, a metal/ceramic circuit board using an aluminum plate as a metal circuit plate has been proposed and put to practical use.

In order to form an aluminum circuit on such an aluminum/ceramic circuit board, there is known a method for forming an aluminum circuit by etching an aluminum plate, which is bonded to a ceramic substrate, with an etchant of a mixed solution consisting of 30 to 40 wt % of ferric chloride, 5 to 15 wt % of hydrochloric acid and the rest of water (see, e.g., Japanese Patent Laid-Open No. 9-3662).

However, if an aluminum plate is etched with the etchant disclosed in Japanese Patent Laid-Open No. 9-3662, there are some cases where aluminum is too violently dissolved in the etchant to precisely form an aluminum circuit. If the metal circuit plate is made of pure aluminum, it is possible to carry out relatively satisfied etching. However, if the metal circuit plate is made of an aluminum alloy containing Si or the like or if a metal circuit plate of aluminum is bonded to a ceramic substrate via a brazing fitter metal containing Al and Si, there is problem in that the linearity of the peripheral edge of a metal circuit pattern deteriorates, so that the peripheral edge of the metal circuit pattern is corrugated to cause a variation in skirt spreading length on the peripheral edge portion of the metal circuit. Thus, there a problem in that it is not possible to ensure a predetermined distance between metal circuits and a predetermined distance between the surface and reverse of a metal/ceramic circuit board. There is also a problem in that abnormal discharge easily occurs when a module is assembled.

SUMMARY OF THE INVENTION

It is therefore an object of the present invention to eliminate the aforementioned problems and to provide a metal/ceramic circuit board wherein the corrugated range of the peripheral edge of a metal circuit pattern and the variation in skirt spreading length are small, even if a metal circuit is made of pure aluminum or an aluminum alloy or even if an aluminum plate of an aluminum alloy is bonded to a ceramic substrate via a brazing filler metal to form a metal circuit, and a method for producing the same.

In order to accomplish the aforementioned and other objects, the inventors have diligently studied and found that it is possible to produce a metal/ceramic circuit board wherein the corrugated range of the peripheral edge of a metal circuit pattern and the variation in skirt spreading length are small, if an etchant of a mixed solution prepared by mixing ferric chloride with water without adding any acids is used when a metal circuit is formed by etching a metal layer containing aluminum as a principal component, such as a metal layer containing aluminum or an aluminum alloy, which is formed on a ceramic substrate.

According to one aspect of the present invention, there is provided a method for producing a metal/ceramic circuit board, the method comprising the steps of: forming a metal layer, which contains aluminum as a principal component, on at least one side of a ceramic substrate; forming a resist having a predetermined shape on the metal layer; and etching and removing an undesired portion of the metal layer with an etchant of a mixed solution, which is prepared by mixing ferric chloride with water without adding any acids, to form a metal circuit on the at least one side of the ceramic substrate.

In this method, the metal layer may be made of aluminum or an aluminum alloy. The Baum'e degree of ferric chloride in the etchant is preferably 40° Be' or more, and more preferably higher than 44° Be'. The concentration of free acids in the etchant is preferably 10 g/L or less. The aluminum alloy may contain 5 wt % or less of at least one element selected from the group consisting of Si, Cu and Ag. The ceramic substrate preferably contains at least one of $Al_2O_3$, AlN, $Si_3N_4$ and SiC. The metal layer may be bonded directly to the at least one side of the ceramic substrate, or bonded to the at least one side of the ceramic substrate via a brazing filler metal. The etchant may essentially consist of ferric chloride and water.

According to another aspect of the present invention, a metal/ceramic circuit board comprises: a ceramic substrate; and a metal circuit plate formed on at least one side of the ceramic substrate, the metal circuit plate containing aluminum as a principal component, wherein the metal circuit plate has a corrugated range of 200 µm or less on a peripheral edge of the metal circuit plate, the corrugated range being the maximum distance between straight lines parallel to a linear peripheral edge of the metal circuit plate to be formed, and the metal circuit plate has a skirt spreading length of 200 µm or less, or a ratio (Ls/d) of 0.5 or less, the ratio (Ls/d) being a skirt spreading length (Ls) to a thickness (d) of the metal circuit plate, and the skirt spreading length being a distance between a plane perpendicular to a principal plane of the metal circuit plate at one end of a bottom face of the metal circuit plate and a plane perpendicular to a principal plane of the metal circuit plate at one end of a top face of the metal circuit plate on the same side as the one end of the bottom face of the metal circuit plate assuming that the distance is positive when the bottom face has a greater area than that of the top face.

In this metal/ceramic circuit board, the metal circuit plate may be made of aluminum or an aluminum alloy. The aluminum alloy may contain 5 wt % or less of at least one element selected from the group consisting of Si, Cu and Ag. The ceramic substrate preferably contains at least one of $Al_2O_3$, AlN, $Si_3N_4$ and SiC.

According to a further aspect of the present invention, a power module is assembled by using the above described metal/ceramic circuit board.

As shown in FIG. 1, throughout the specification, the term "skirt spreading length" means the dimensional difference (Ls) between the bottom and top edges of the peripheral edge portion of a metal circuit plate 12 formed on a ceramic substrate 10. This difference (Ls) is the distance between a plane perpendicular to the principal plane of the metal circuit plate 12 at one end of the bottom face of the metal circuit plate 12 and a plane perpendicular to the principal plane of the metal circuit plate 12 at one end of the top face of the metal circuit plate 12 on the same side as the one end of the bottom face of the metal circuit plate 12. It is assumed that the sign of the distance is positive (+) when the area of the bottom face of the metal circuit plate 12 is greater than the area of the top face thereof. As shown in FIG. 2, throughout the specification, the term "corrugated range" means a range W displaced from the straight line of the peripheral edge of the metal circuit plate 12. That is, the corrugated range is the maximum distance between straight lines (shown by chain lines) parallel to a linear peripheral edge of the metal circuit plate 12 to be formed.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings.

DESCRIPTION OF THE PREFERRED EMBODIMENTS

Referring now to the accompanying drawings, the preferred embodiment of a metal/ceramic circuit board and a method for producing the same according to the present invention will be described below.

Figure 1:
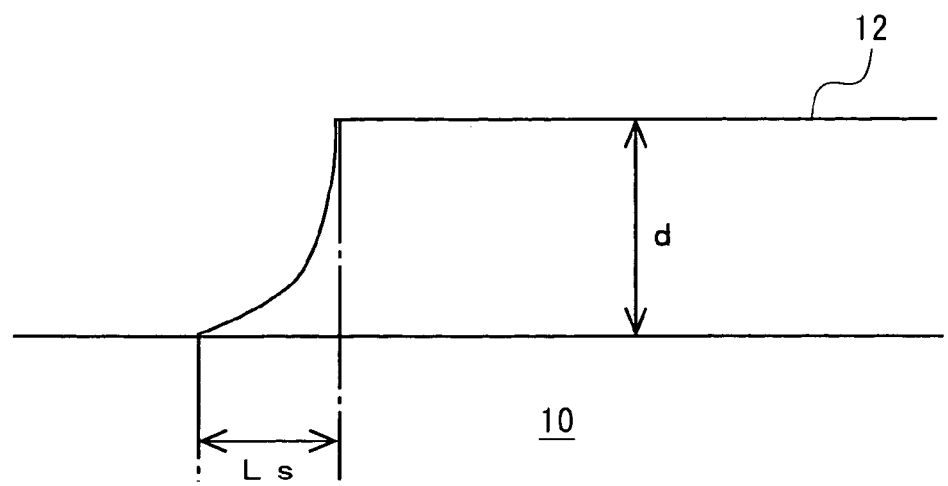
FIG. 1 is an illustration for explaining the skirt spreading length on the peripheral edge portion of a metal circuit plate formed on a ceramic substrate.
Figure 2:
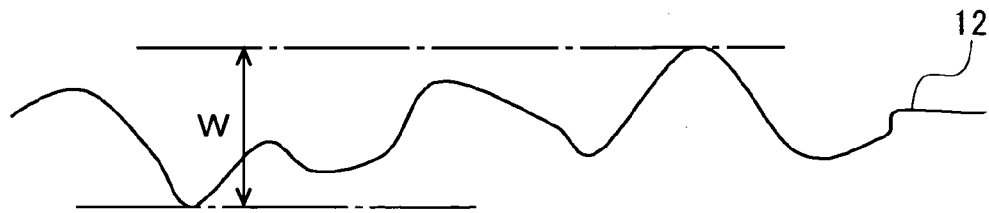
FIG. 2 is an illustration for explaining the corrugated range of the peripheral edge of a metal circuit plate.
Figure 3A:
FIGS. 3A through 3C are sectional views for explaining the preferred embodiment of a method for producing a metal/ceramic circuit board according to the present invention.
Figure 3B:
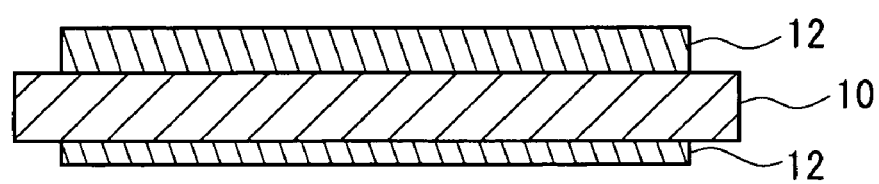
Figure 3C:
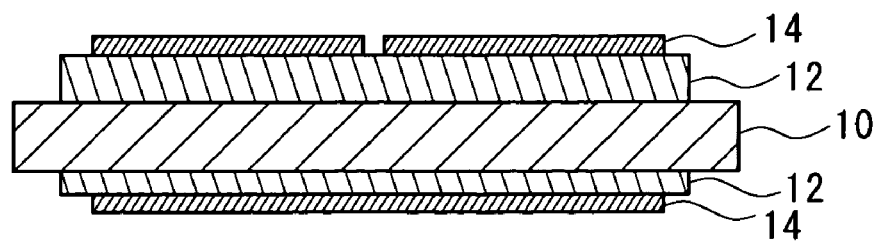

First, as shown in FIGS. 3A through 3C, after a ceramic substrate 10 of $Al_2O_3$, AlN, $Si_3N_4$ or SiC is prepared (FIG. 3A), metal plates 12 of aluminum or an aluminum alloy containing 5 wt % or less of at least one element selected from the group consisting of Si, Cu and Ag are bonded to both sides of the ceramic substrate 10 by a bonding method, such as the molten metal bonding method or the brazing and soldering method (FIG. 3B), and thereafter, etching resists 14 having a predetermined shape are formed on the metal plates 12 (FIG. 3C). Furthermore, the reason why the content of the at least one element, which is selected from the group consisting of Si, Cu and Ag, in the aluminum alloy is 5 wt % or less is that there are some cases the conductivity and etching characteristics of the metal plate 12 and the thermal shock resistance of the metal/ceramic circuit board may be deteriorated if the content exceeds 5 wt %.

Figure 4A:
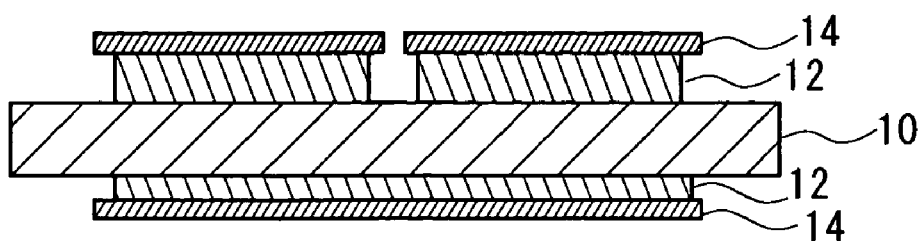
FIGS. 4A and 4B are sectional views for explaining the preferred embodiment of a method for producing a metal/ceramic circuit board according to the present invention.
Figure 4B:
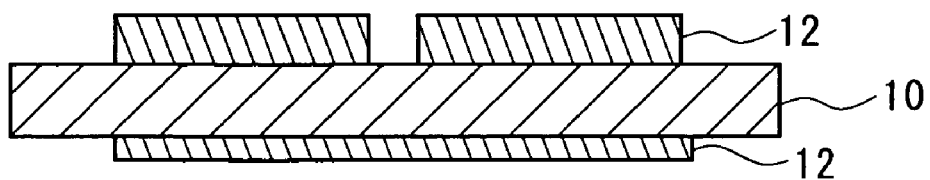

Then, as shown in FIGS. 4A and 4B, an etchant of a mixed solution, which is prepared by mixing ferric chloride with water without adding any acids so that the Baum'e degree of ferric chloride is 40° Be' or more and preferably higher than 44° Be', is used for etching the metal plate 12 to form a metal circuit plate (FIG. 4A), and thereafter, the etching resists 14 are removed (FIG. 4B).

Thus, it is possible to produce a metal/ceramic circuit board wherein the corrugated range of the peripheral edge of the metal circuit plate is 200 µm or less and wherein the skirt spreading length on the peripheral edge portion of the metal circuit plate is 200 µm or less, or the ratio (Ls/d) of the skirt spreading length (Ls) to the thickness (d) of the metal circuit plate is 0.5 or less. If the corrugated range and the skirt spreading length or the ratio of the skirt spreading length to the thickness of the metal circuit plate are such values, it is possible to ensure a predetermined distance between metal circuits and a predetermined distance between the surface and reverse of the metal/ceramic circuit board, and it is possible to prevent abnormal discharge when the metal/ceramic circuit board is used for assembling a module. More preferably, in order to prevent abnormal discharge and in order to decrease the size of the metal/ceramic circuit board, the corrugated range of the peripheral edge of the metal circuit plate is 150 µm or less, and the skirt spreading length is 150 µm or less, or the ratio (Ls/d) of the skirt spreading length (Ls) to the thickness (d) of the metal circuit plate is 0.38 or less. In order to obtain such a metal/ceramic circuit board, the Baum'e degree of ferric chloride in the etchant is preferably higher than 44° Be'.

Furthermore, if a free acid exists in the etchant, a side dissolving reaction other than a dissolving reaction in ferric chloride occurs, so that it is difficult to control the dissolution balance between the free acid and ferric chloride. In particular, if there is a difference in dissolving rate between aluminum and an aluminum alloy in the free acid, the corrugated range of the peripheral edge of the metal circuit plate may be easily increased. Therefore, the concentration of the free acid in the etchant is preferably 10 g/L or less, and more preferably 1 g/L or less. If the concentration of the free acid in the etchant is higher than 10 g/L or if the Baum'e degree of ferric chloride in the etchant is lower than 40° Be', solid ferric chloride, a slurry of iron hydroxide and/or water may be added to the etchant to adjust the concentration of the free acid or the Baum'e degree of ferric chloride if necessary. Alternatively, solid ferric chloride may be directly dissolved in water to prepare the etchant since solid ferric chloride contains hardly free acids.

The oxidation-reduction potential (ORP) of the etchant is preferably controlled in a predetermined range so as to be capable of economically utilizing the etchant and fixing the etching rate to industrially carry out mass-production.

That is, after ferric chloride acts upon etching, ferrous chloride having no etching capability is produced. Therefore, if ferric chloride is not reproduced from ferrous chloride, the etching rate can not be constant, and there are some cases where etching can not be carried out. The oxidation-reduction potential can be substituted for the relationship between the amount of ferrous chloride and the amount of ferric chloride. Therefore, in order to carry out good etching, the oxidation-reduction potential of the etchant is preferably controlled in a predetermined range by the temperature and concentration of the etchant.

In fact, the oxidation-reduction potential is preferably controlled by supplying the etchant with hydrogen peroxide. Even in a case where an acid unavoidably enters the etchant, the ratio $A_{H2O2}/A_{H(acid)}$ of the mass $A_{H2O2}$ (mol) of hydrogen peroxide to the hydrogen equivalent mass $A_{H(acid)}$ (mol) of the acid is preferably 0.5 or more.

Examples of a metal/ceramic circuit board and a method for producing the same according to the present invention will be described below in detail.

EXAMPLE 1

Aluminum (4N) was used for carrying out the molten metal bonding method to bond an aluminum plate having a thickness of 0.4 mm to one side of an aluminum nitride (AlN) substrate having a size of 77 mm×88 mm×0.635 mm, and to bond an aluminum plate having a thickness of 0.15 mm to the other side thereof. On both sides of the bonding article thus obtained, alkali peeling type etching resists having a shape approximating the shape of a metal circuit were formed by the screen printing method.

Then, an etchant of a mixed solution, which was prepared by mixing ferric chloride with water without adding any acids so that the Baum'e degree of ferric chloride is 47° Be', was used for etching the aluminum plates at a temperature of 40° C. under a spray pressure of 1.0 kgf/cm$^2$ while holding an average distance of 110 mm between the bonding article and an etching spray nozzle. Furthermore, the concentration of free acids in the etchant was 1 g/L or less. Then, the bonding article was dipped in a 3% NaOH solution at a room temperature for three minutes to remove the etching resists.

By such a method, ten aluminum/ceramic circuit boards were produced. With respect to the aluminum circuit plate having the thickness of 0.4 mm on each of the aluminum/ceramic circuit boards, the skirt spreading length and the corrugated range of the pattern were measured. As a result, the maximum value of the skirt spreading length was 121 μm, and the minimum value thereof was 77 μm. In addition, the mean value of the skirt spreading length was 102 μm, and the variation thereof was 44 μm. Moreover, the maximum value of the corrugated range of the pattern was 103 μm, the minimum value thereof was 31 μm, and the mean value thereof was 69 μm, so that good results were obtained.

EXAMPLE 2

Ten aluminum/ceramic circuit boards were produced by the same method as that in Example 1, except that an aluminum alloy containing 0.5 wt % of Si was substituted for aluminum. Furthermore, the concentration of free acids in the etchant was 1 g/L or less.

With respect to the aluminum circuit plate having the thickness of 0.4 mm on each of the aluminum/ceramic circuit boards thus produced, the skirt spreading length and the corrugated range of the pattern were measured. As a result, the maximum value of the skirt spreading length was 123 μm, and the minimum value thereof was 65 μm. In addition, the mean value of the skirt spreading length was 95 μm, and the variation thereof was 58 μm. Moreover, the maximum value of the corrugated range of the pattern was 131 μm, the minimum value thereof was 40 μm, and the mean value thereof was 91 μm, so that good results were obtained.

EXAMPLE 3

Ten aluminum/ceramic circuit boards were produced by the same method as that in Example 2, except that the Baum'e degree of ferric chloride was 45° Be'. Furthermore, the concentration of free acids in the etchant was 1 g/L or less.

With respect to the aluminum circuit plate having the thickness of 0.4 mm on each of the aluminum/ceramic circuit boards thus produced, the skirt spreading length and the corrugated range of the pattern were measured. As a result, the maximum value of the skirt spreading length was 141 μm, and the minimum value thereof was 71 μm. In addition, the mean value of the skirt spreading length was 99 μm, and the variation thereof was 70 μm. Moreover, the maximum value of the corrugated range of the pattern was 129 μm, the minimum value thereof was 50 μm, and the mean value thereof was 89 μm, so that good results were obtained.

EXAMPLE 4

Ten aluminum/ceramic circuit boards were produced by the same method as that in Example 2, except that the Baum'e degree of ferric chloride was 43° Be'. Furthermore, the concentration of free acids in the etchant was 1 g/L or less.

With respect to the aluminum circuit plate having the thickness of 0.4 mm on each of the aluminum/ceramic circuit boards thus produced, the skirt spreading length and the corrugated range of the pattern were measured. As a result, the maximum value of the skirt spreading length was 134 μm, and the minimum value thereof was 81 μm. In addition, the mean value of the skirt spreading length was 103 μm, and the variation thereof was 53 μm. Moreover, the maximum value of the corrugated range of the pattern was 177 μm, the minimum value thereof was 70 μm, and the mean value thereof was 139 μm, so that good results were obtained.

EXAMPLE 5

Ten aluminum/ceramic circuit boards were produced by the same method as that in Example 2, except that the Baum'e degree of ferric chloride was 40° Be'. Furthermore, the concentration of free acids in the etchant was 1 g/L or less.

With respect to the aluminum circuit plate having the thickness of 0.4 mm on each of the aluminum/ceramic circuit boards thus produced, the skirt spreading length and the corrugated range of the pattern were measured. As a result, the maximum value of the skirt spreading length was 139 μm, and the minimum value thereof was 70 μm. In addition, the mean value of the skirt spreading length was 100 μm, and the variation thereof was 69 μm. Moreover, the maximum value of the corrugated range of the pattern was 196 μm, the minimum value thereof was 89 μm, and the mean value thereof was 163 μm, so that good results were obtained.

COMPARATIVE EXAMPLE 1

Ten aluminum/ceramic circuit boards were produced by the same method as that in Example 2, except that an etchant of a mixed solution consisting of ferric chloride having a Baum'e degree of 22° Be', 4 wt % of HCl and water was used and that the temperature of the etchant was 35° C. Furthermore, the concentration of free acids in the etchant was about 40 g/L.

With respect to the aluminum circuit plate having the thickness of 0.4 mm on each of the aluminum/ceramic circuit boards thus produced, the skirt spreading length and the corrugated range of the pattern were measured. As a result, the maximum value of the skirt spreading length was 294 μm, and the minimum value thereof was 119 μm. In addition, the mean value of the skirt spreading length was 201 μm, and the variation thereof was 174 μm, so that the skirt spreading length was long and the variation thereof was large. Moreover, the maximum value of the corrugated range of the pattern was 387 μm, the minimum value thereof was 177 μm, and the mean value thereof was 298 μm, so that the corrugated range of the pattern was large.

COMPARATIVE EXAMPLE 2

Ten aluminum/ceramic circuit boards were produced by the same method as that in Example 2, except that the Baumé degree of ferric chloride was 37° Be'. Furthermore, the concentration of free acids in the etchant was 1 g/L or less.

With respect to the aluminum circuit plate having the thickness of 0.4 mm on each of the aluminum/ceramic circuit boards thus produced, the skirt spreading length and the corrugated range of the pattern were measured. As a result, the maximum value of the skirt spreading length was 205 μm, and the minimum value thereof was 100 μm. In addition, the mean value of the skirt spreading length was 141 μm, and the variation thereof was 105 μm, so that the skirt spreading length was long and the variation thereof was large. Moreover, the maximum value of the corrugated range of the pattern was 289 μm, the minimum value thereof was 135 μm, and the mean value thereof was 221 μm, so that the corrugated range of the pattern was large.

Furthermore, the results in Examples 1 through 5 and Comparative Examples 1 and 2 are shown in Table 1.

TABLE 1

|  | Skirt Spreading Length | | | Corrugated Range of Pattern | | |
| --- | --- | --- | --- | --- | --- | --- |
|  | Mean (μm) | Maximum (μm) | Minimum (μm) | Mean (μm) | Maximum (μm) | Minimum (μm) |
| Ex. 1 | 102 | 121 | 77 | 69 | 103 | 31 |
| Ex. 2 | 95 | 123 | 65 | 91 | 131 | 40 |
| Ex. 3 | 99 | 141 | 71 | 89 | 129 | 50 |
| Ex. 4 | 103 | 134 | 81 | 139 | 177 | 70 |
| Ex. 5 | 100 | 139 | 70 | 163 | 196 | 89 |
| Comp. 1 | 201 | 294 | 119 | 298 | 387 | 177 |
| Comp. 2 | 141 | 205 | 100 | 221 | 289 | 135 |

As described above, according to the present invention, it is possible to provide a metal/ceramic circuit board wherein the corrugated range of a metal circuit pattern and the variation in skirt spreading length are small, even if a metal circuit is made of pure aluminum or an aluminum alloy, and a method for producing the same.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A method for producing a metal/ceramic circuit board, said method comprising the steps of:

forming a metal layer of aluminum or an aluminum alloy, which contains aluminum as a principal component, on at least one side of a ceramic substrate;

forming a resist having a predetermined shape on said metal layer; and etching and removing an undesired portion of said metal layer with an etchant which consists essentially of ferric chloride and water and which has a Baum'e degree of higher than 44° Be', to form a metal circuit plate on said at least one side of said ceramic substrate, wherein said metal circuit plate has a corrugated range of 200 μm or less on a peripheral edge of said metal circuit plate, said corrugated range being the maximum distance between straight lines parallel to a linear peripheral edge of said metal circuit plate to be formed, and said metal circuit plate has a skirt spreading length of 200 μm or less, or a ratio (Ls/d) of 0.5 or less, said ratio (Ls/d) being a skirt spreading length (Ls) to a thickness (d) of said metal circuit plate, and said skirt spreading length being a distance between a plane perpendicular to a principal plane of said metal circuit plate at one end of a bottom face of said metal circuit plate and a plane perpendicular to a principal plane of said metal circuit plate at one end of a top face of said metal circuit plate on the same side as said one end of said bottom face of said metal circuit plate assuming that said distance is positive when said bottom face has a greater area than that of said top face.

2. A method for producing a metal/ceramic circuit board as set forth in claim 1, wherein said etchant contains 10 g/L or less of free acids.

3. A method for producing a metal/ceramic circuit board as set forth in claim 1 wherein said aluminum alloy contains 5 wt % or less of at least one element selected from the group consisting of Si, Cu and Ag.

4. A method for producing a metal/ceramic circuit board as set forth in claim 1, wherein said ceramic substrate contains at least one of $Al_2O_3$, AlN, $Si_3N_4$ and SiC.

5. A method for producing a metal/ceramic circuit board as set forth in claim 1, wherein said metal layer is bonded directly to said at least one side of said ceramic substrate, or bonded to said at least one side of said ceramic substrate via a brazing filler metal.

6. A method for producing a metal/ceramic circuit board as set forth in claim 1, wherein said corrugated range is 150 μm or less, and said skirt spreading length is 150 μm or less, or said ratio (Ls/d) is 0.38 or less.

* * * * *